United States Patent [19]

Lightner et al.

[11] Patent Number: 4,795,526

[45] Date of Patent: Jan. 3, 1989

[54] DETAPING APPARATUS

[75] Inventors: John J. Lightner, Lake Zurich; Nassim A. Samaan, Zion, both of Ill.

[73] Assignee: Lightner Associates Inc., Rolling Meadows, Ill.

[21] Appl. No.: 40,192

[22] Filed: Apr. 16, 1987

[51] Int. Cl.[4] .............................................. B32B 31/10
[52] U.S. Cl. ...................................... 156/584; 156/344
[58] Field of Search ........................ 156/584, 568, 344

[56] References Cited

U.S. PATENT DOCUMENTS 3,897,293  7/1975  Babcock .......................... 156/584 X
4,597,176  7/1986  Shields et al. ................... 81/9.51 X Primary Examiner—Frank Spear
Attorney, Agent, or Firm—Foley & Lardner

[57] ABSTRACT

An apparatus for automatically detaping taped components without cutting or otherwise damaging the leads, using a pair of index wheels, rotating about different axes in synchronism.

9 Claims, 3 Drawing Sheets

DETAPING APPARATUS

BACKGROUND OF THE INVENTION

The present invention relates to apparatus for removing electronic components from tape.

Automated mechanisms for insertion of electronic components into circuit boards have become prevalent in the industry. To facilitate handling, the automatic insertion machines utilize tapes of components fed from reels, i.e., the leads of components are interconnected by strips of adhesive tape. Industry standards, e.g., EIA RS 296, have been established with respect to the width of the tape, the relative disposition of the strips of tape on the leads, and the distance between successive leads on the tape. With respect to axial leaded components, strips of tape, one-quarter inch wide, are disposed on the respective leads of the component, equidistant from the component body. The distance between the inner edges of the respective tapes varies in accordance with the classification of the component tape. By convention, the distance between the inner edges of the respective tapes are 2.06 inches, 2.50 inches, and 2.875 inches, within a plus or minus 0.06 inch tolerance, for class I, class II and class III-type tapes respectively. In accordance with industry standards, the distance between successive leads on the tape (sometimes referred to as "pitch") is a multiple of 0.200 inch (5 mm). The particular multiple of 0.200 inch is chosen in accordance with the diameter of the component body. Component body diameter typically ranges from 0.062 inch to 0.394 inch (2 mm to 10 mm). Concomitantly, component pitch ranges from 0.200 inch to 0.400 inch (5 mm to 10 mm).

However, it occasionally becomes necessary to remove the components from the tape without cutting or damaging the component leads. For example, it is sometimes necessary to test or reprocess components that have been shelved for extended periods; components with pre-tinned leads that have been shelved for extended periods may require periodic re-tinning due to oxidation. Similarly, in some instances, process or lead forming requirements preclude any loss of lead length during the detaping process.

In the past, it has been necessary to remove the components from the tape by hand.

SUMMARY OF THE INVENTION

The present invention provides an apparatus for automatically detaping taped components without cutting or otherwise damaging the leads. This is accomplished by utilizing a pair of index (e.g., toothed) wheels. The first index wheel is disposed for rotation about a first axis, while the second wheel is disposed for rotation about a second axis at a predetermined angle with respect to the first axis. A mechanism is provided to rotate the respective index wheels in sychronism. Thus, as the index wheels rotate through a cycle about their respective axes, the distance between corresponding points along the perimeter of the wheels varies as a function of position within the cycle. The tape of components is applied to the mechanism so that the leads of each component in sequence are engaged. The initial of the leads occurs at a predetermined position in the cycle, so that the index wheels engage the lead between the tape and the component body. Thereafter, as the wheels rotate through their cycle, the distance between the points at which the wheels engage the lead increases, ultimately stripping the tape from the lead.

In accordance with another aspect of the present invention, the offset angle between the respective axes is chosen in accordance with the distance of the inside edge of the tape from the end of the lead. Preferably, the angle is in the range of from 8 to 8½ degrees.

In accordance with another aspect of the present invention, an embodiment particularly suited for axial leaded components includes respective pairs of first and second index wheels. The body of each component in sequence is received between respective first index wheels, and the respective pairs of wheels cooperate to remove the strips of adhesive tape from the respective ends of the leads.

A BRIEF DESCRIPTION OF THE DRAWING

A preferred exemplary embodiment of the present invention will hereinafter be described with reference to the appended drawing, wherein like numerals denote like elements, and:

DETAILED DESCRIPTION OF A PREFERRED EXEMPLARY EMBODIMENT

Figure 1:
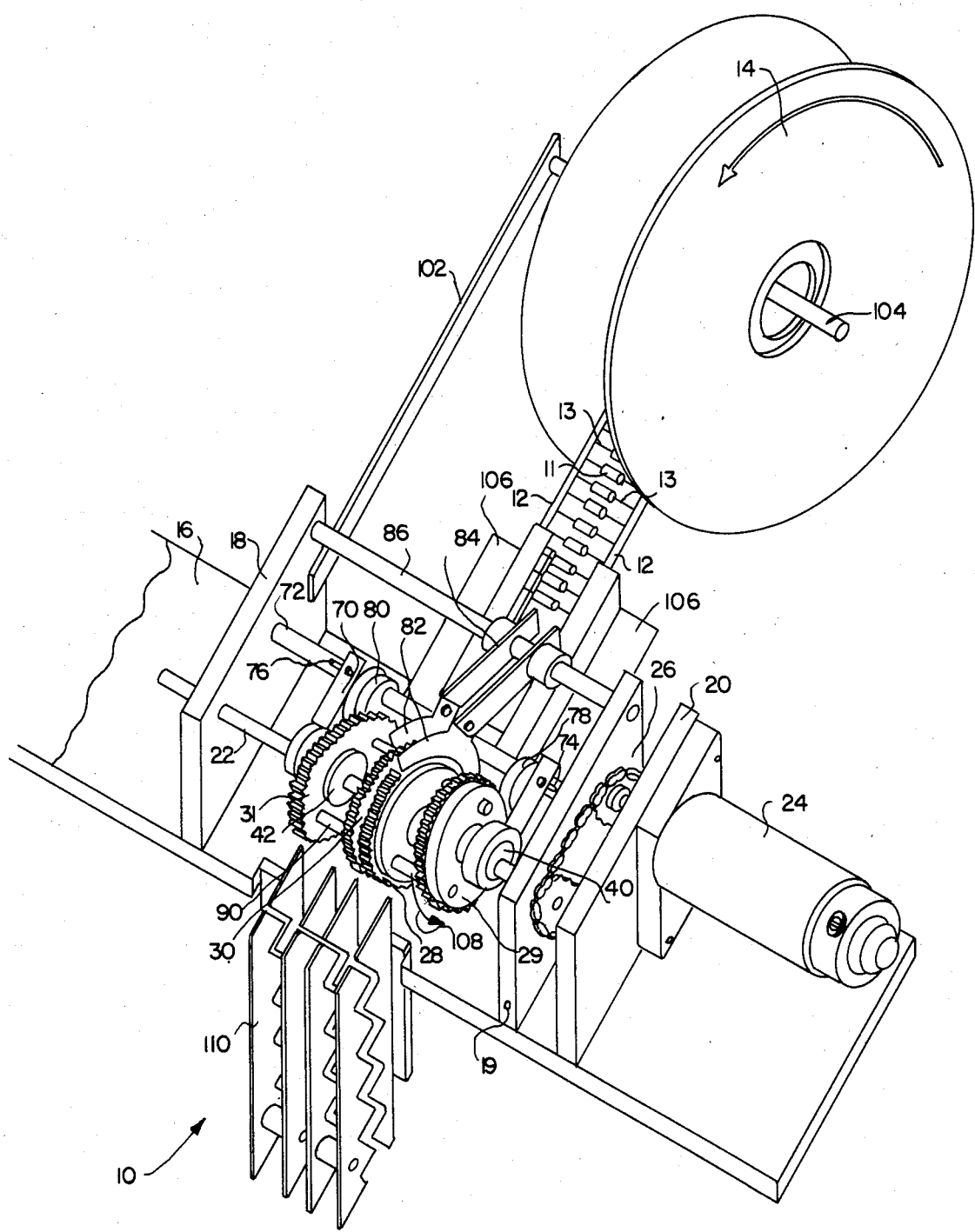
FIG. 1 is a perspective view of a detaping apparatus in accordance with the present invention.

Referring now to FIG. 1, a detaping apparatus 10, in accordance with the present invention, cooperates with a tape of axial leaded components dispensed from a reel 14. The respective leads 13 of the individual components are maintained at standard relative distances (pitch) by respective strips of adhesive tape 12. Tape strips 12 are disposed equidistant from the component body 11, spaced apart by a predetermined amount, suitably in accordance with industry standard.

Detaping apparatus 10 comprises: a base plate 16 bearing respective mounting plates 18, 19 and 20; a drive shaft 22, cam shaft 72, and bearing rod 86, each extending between mounting plates 18 and 19; respective index wheel assemblies 28 and 30, disposed for rotation about the axis of shaft 22, and 29 and 31, disposed for rotation about an axis angularly offset from the axis of shaft 22; respective pressure cams 78 and 80, and bearing guides 82; a suitable drive mechanism for rotating shaft 22, such as a motor 24 and chain drive 26; a reel holder 102; a guide tray 106 for guiding the taped components into interaction with index wheels 28–31; and a suitable receiving mechanism for detaped components, such as a chute 110.

Briefly, index wheels 28 and 30 are fixed to, and rotate about the axis of, drive shaft 22. Index wheels 29 and 31, however, while driven in synchronism with index wheels 28 and 30, rotate about axes which are offset by a predetermined angle from the axis of shaft 22. Accordingly, the distance between corresponding portions of index wheels 28 and 29, and 30 and 31, vary as the wheels proceed through a rotational cycle.

The component tape is dispensed from reel 14, and guided by guide tray 106 into initial engagement with index wheels 28–31. Initial engagement between index wheels 28–31 and each of the taped components in turn, is made at a position within the rotational cycle of the index wheels where index wheels 28 and 29 and 30 and 31 are relatively proximate; index wheels 28 and 30 engage component leads 13 on either side of component body 11 and index wheels 29 and 31 engage leads 13 interiorly of the inside edge of tape strips 12. Pressure cams 78 and 80 and bearing guides 82 bias the leads against index wheels 28–31 to ensure continued engagement of the components. As index wheels 28–31 proceed through the rotational cycle, index wheels 29 and 31 slide outwardly along leads 13, forcing tape strips 12 off of the leads. After tape 12 is removed, index wheels 28–31 release the detaped component, still in sequence, to chute 110.

Mounting plates 18, 19 and 20 provide mounting support for the respective elements of detaping apparatus 10. Plates 18–20 are suitably fixed to base plate 16 in perpendicular disposition. Conventional means, such as, for example, screws extending through base plate 16 into threaded bores in mounting plates 18–20, are employed to secure plates 18–20 to base 16.

The ends of cam shaft 72 and bearing rod 86 are suitably received in bores formed in mounting plates 18 and 19 and axially and radially fixed with respect to the mounting plates by set screws (not shown).

Drive shaft 22 is rotatably mounted between mounting plates 18 and 19, journaled through respective bores in mounting plates 18 and 19. Preferably, respective bushings or bearings (not shown) are utilized to facilitate rotation.

The drive mechanism for effecting rotation of drive shaft 22 is coupled to the end of drive shaft 22 extending through plate 19. Electric motor 24 is secured to mounting plate 20, with the motor shaft journaled through mounting plate 20, and is operatively coupled to drive shaft 22 by chain drive 26.

Figure 2:
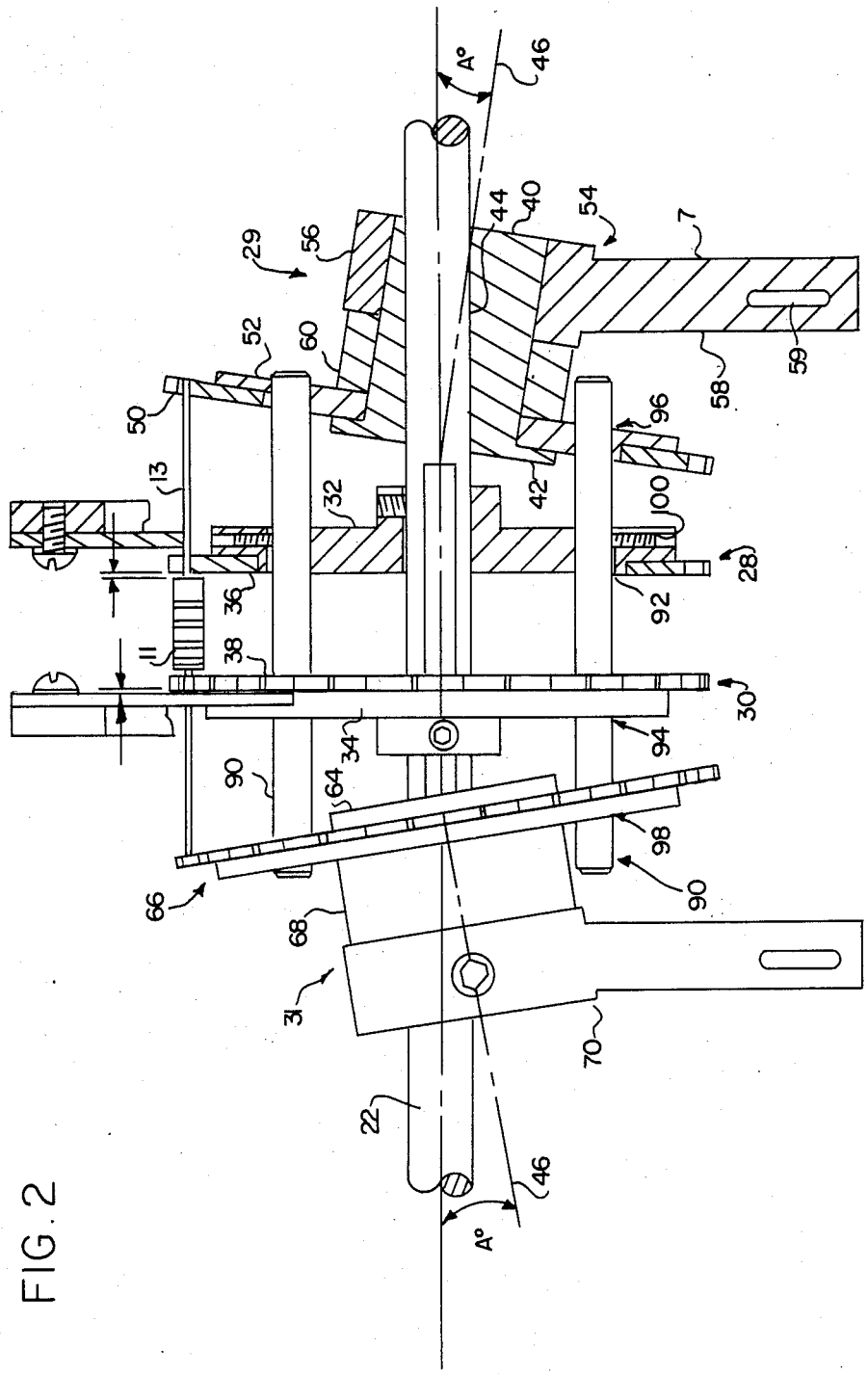
FIG. 2 is a partially sectioned schematicized illustration of the respective index wheels of the detaping apparatus of FIG. 1.

Index wheels 28 and 30 are disposed on drive shaft 22 for rotation with drive shaft 22 about its axis. Referring now to FIG. 2, index wheels 28 and 30 suitably comprise respective wheel hubs 32 and 34, and conventional pitch gears (peripherally toothed rings) 36 and 38. Pitch gears 36 and 38 are suitably fixed to hubs 32 and 34 by flathead screws cooperating with threaded bores (neither shown) in hubs 32 and 34 to effectively provide index wheels 28 and 30 with peripheral teeth. The pitch of pitch gears 36 and 38 and, thus, the circumference of the gears, is chosen as a function of the spacing between adjacent leads on the tape. In the preferred embodiment, gears 36 and 38 have a pitch of 0.2 inch (5 mm) and include 54 teeth. Gears 36 and 38 are disposed on hubs 32 and 34, with the teeth of the respective gears generally in registry. Hubs 32 and 34 each include a central bore for receiving drive shaft 22. Drive shaft 22 suitably includes respective flats which cooperate with set screws in hubs 32 and 34, to fix hubs 32 and 34, both axially and rotationally, to drive shaft 22.

Drive shaft 22 is also journaled through index wheels 29 and 31. More specifically, index wheel 29 includes a cam 40, a holding mechanism (holder) 54, a spacing bearing 60, a hub 52 and a conventional pitch gear 50. Cam 40 is formed of bronze or brass and is is generally cylindrical in shape, with a peripheral flange 42 at one end. A bore 44 is formed through cam 40, extending from the center of the flanged front face through cam 40 at a predetermined angle, A, from a center axis. Shaft 22 is rotatably received through bore 44. A separate bearing can be utilized, if desired. As will be explained, shaft 22 thus rotates freely in bore 44, while cam 40 is maintained in a stationary position by holder 54.

Index wheels 29 and 31, however, rotate about axis 46, angularly offset from the axis of drive shaft 22 by predetermined angle, A. Angle A is chosen in accordance with the distance from the inner edge of tape 12 to the end of the component lead. Like index wheels 28 and 30, pitch gear 50 is maintained on hub 52, effectively providing index teeth about the periphery of the wheel. Gear 50 is substantially identical to gears 36 and 38, and the teeth of gear 50 are maintained in general registry with the teeth of gears 36 and 38. Hub 52 is rotatably mounted on cam 40; hub 42 includes a central bore which receives cam 40. Hub 52 and, thus, in effect, index wheel 29, therefore rotate about axis 46 of cam 40.

Holder 54 cooperates with flange 42 of cam 40 and bushing 60 to retain hub 52 rotatably on cam 40 and to maintain cam 40 in a desired radial position with respect to drive shaft 22. Varying the radial position of cam 40 permits adjustment of the positions of greatest divergence and closest proximity of index wheels 28 and 29 and 30 and 31, within the rotational cycle. Holder 54 includes an annular portion 56 and connecting arm 58. Hub 52 is disposed on cam 40 in the proximity of flange 42, and bushing 60 thereafter placed on cam 40. The unflanged end of cam 40 is received in a central bore provided in annular portion 56. Cam 40 is suitably secured within holder 54 by one or more set screws extending through the walls of annular portion 56. Spacer bushing 60 is interposed between annular portion 56 and hub 52 to limit axial movement of hub 52 and facilitate rotation of hub 52 abut cam 40.

Holder 54 also maintains the axial position of index wheel 29 on shaft 22. A slot aperture 59 is provided in connecting arm 58. With reference now to FIG. 1, holder 52 is slidably fixed to cam shaft 72. A slot aperture 74 is provided in cam shaft 72. In assembly, aperture 59 of connecting arm 58 is placed in registry with slot 74. Holder 54 is connected to cam shaft 72 by a bolt passing through the respective apertures.

Index wheel assembly 31 is similar to index wheel assembly 29 and comprises: a cam 64, analogous to cam 40; a hub and pitch gear, generally indicated as 66, analogous to hub 54 and gear 50; a spacer bushing 68 analogous to bushing 60; and a holder 70 analogous to holder 54. Holder 70 is bolted to a slot aperture 76 in cam shaft 72.

The relative axial positions of index wheel assemblies 28 and 30, and 29 and 31, along drive shaft 22 are established in accordance with the characteristics of the component tape. Index wheels 28 ad 30 are separated by a distance equal to the length of component body 11 plus a suitable clearance, e.g., 0.03 inch on each side.

Index wheels 29 and 31 are disposed so that, at a predetermined position in the rotational cycle, preferably the point of greatest divergence from index wheels 28 and 30, index wheels 29 and 31 are disposed equidistant from the center of component body 11 with the ends of leads 13 substantially flush with the outside surfaces of the pitch gear. Angle A is chosen so that the difference in the distances between wheels 28 and 29, and 30 and 31 at the point of greatest divergence and point of closest proximity is greater than the distance from the end of lead 13 to the inner edge of tape 12.

With reference now to FIGS. 1 and 2, index wheels 29 and 31, which rotate about the axes 46 of cams 40 and 64, are driven in synchronism with index wheels 28 and 30. Wheels 28 and 30 rotate with drive shaft 22. Respective drive rods 90 are provided to interconnect index wheels 28 and 29, and 30 and 31. Rods 90 are journaled through bores 92, 94, 96 and 98 in index wheels 28, 30, 29 and 31, respectively. Rods 90 are axially and radially secured, suitably by set screws (e.g., set screw 100) extending through hubs 32 and 34. Cooperating flats in drive rods 90 may be provided. Rods 90 are slidably received in offset bores 96 and 98 to permit axial movement of wheels 29 and 31 with respect to drive rods 90 during the course of a rotation. Drive rods 90 are centered, and extend equal distances beyond bores 96 and 98, respectively, throughout the rotational cycle. It should be appreciated that journaling drive shaft 22 through index wheel assemblies 29 and 31, and driving wheels 29 and 31 with rods 90, provides additional stability to the apparatus.

Figure 3:
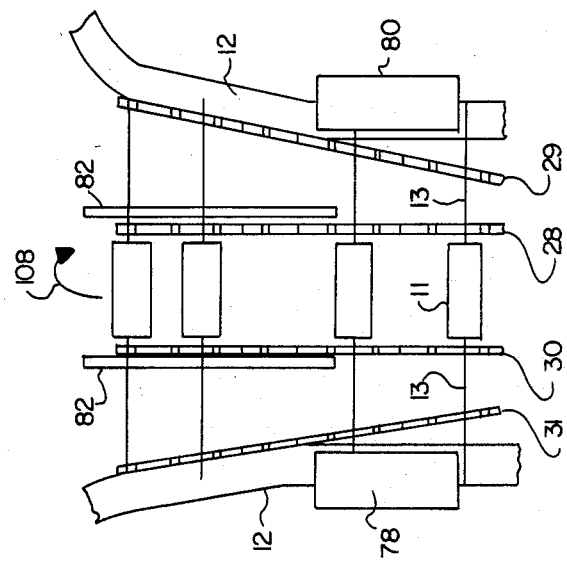
FIG. 3 is a schematic diagram illustrating the detaping cycle of the detaping apparatus of FIG. 1.

Pressure cams 78 and 80 and bearing guides 82 ensure continued engagement of leads 13 by the teeth of the pitch gears of index wheels 28–31. Cams 78 and 80 are pivotally disposed on cam shaft 72, axially and radially secured by set screws (not shown). Referring now to FIGS. 1 and 3, cams 78 and 80 are disposed axially adjacent to index wheels 29 and 31 overlying tape strips 12 in an area corresponding to a portion of the rotational cycle where index wheels 28 and 29 and 30 and 31 are in relative proximity. The peripheral surfaces of cams 78 and 80 are disposed to contact tape strips 12, and provide a bias on tape strips 12 (and, thus, leads 13) towards index wheels 29 and 31, maintaining the leads within the teeth of the index wheel pitch gears. By varying the pivotal disposition of cams 78 and 80 on cam shaft 72, the extent to which the periphery of cams 78 and 80 extend toward index wheels 29 and 31 can be adjusted to accommodate leads of varying diameters.

Bearing guides 82 similarly cooperate with index wheels 28 and 30 to maintain leads 13 within the teeth of the index wheels. Bearing guides 82 are truncated in FIG. 1 for ease of illustration. In practice, however, the guides extend over an arc of on the order of 180 degrees or more. Bearing guides 82 are suitably pivotally connected to arms 84, which are, in turn, pivotally connected to rod 86. Bearing guides 82 are disposed in close proximity to the pitch gears of index wheels 28 and 30. The axial clearance between bearing guides 82 and the pitch gears of index wheels 28 and 30 is suitably on the order of 0.03 inch. Bearing guides 82 extend downwardly beyond the points of the index wheel pitch gear teeth and bear down on leads 13 to ensure leads 13 remain engaged by the index wheels, and that component body 11 remains between index wheels 28 and 30.

Referring again to FIG. 1, reel holder 102 couples reel 14 to detaping apparatus 10. Reel holder 102 is suitably bolted to mounting plate 18. Reel 14 is rotatably disposed on a transverse rod 104 maintained at the distal end of reel holder 102. Respective washers, a spring, and a clamping collar (none shown) are suitably provided to maintain reel 14 on rod 104, and provide an adjustable friction drag on rotation of reel 14.

In operation, the tape of components from reel 14 is received by guide tray 106. Guide tray 106 is suitably bolted or otherwise affixed to base plate 16. The tape of components exits guide tray 106 in the vicinity of index wheels 28–31, with body 11 of the components substantially centered between index wheels 28 and 30, and at a point in the cycle where wheels 29 and 31 are relatively close to wheels 28 and 30.

After exiting tray 106, leads 13 of the components are engaged by the teeth of index wheels 28–31, with wheels 28 and 30 on either side of body 11, and wheels 29 and 31 between body 11 and the interior edge of tape strips 12. Initial threading of the tape of components through tray guide 106 and initial engagement of the tape of components by index wheels 28–31 is suitably effected by hand. If desired, however, a mechanism can be provided to facilitate initial engagement of the components by index wheels 28–31. Thereafter, rotation of index wheels 28–31, in interaction with the component tape, draws the component tape from reel 14.

Referring now to FIGS. 1 and 3, index wheels 28–31 are rotated in a direction indicated by arrow 108, causing tape strips 12 (and, thus, the ends of leads 13) to come under pressure cams 78 and 80. As noted above, cams 78 and 80 ensure that leads 13 remain engaged by the teeth of wheels 28–31.

Ultimately, the components are moved under bearing guides 82, which succeed cams 78 and 80 in ensuring that engagement of the leads by the teeth of wheels 28–31 is maintained. If desired, some overlap between cams 78 and 80 and bearing guides 82 may be provided to ensure continuity of biasing on the leads.

The point of initial engagement is chosen to be a position in the cycle where index wheels 29 and 31 are relatively close to index wheels 28 and 30, to engage leads 13 between body 11 and the interior edge of tape 12. The component is received with the leads riding on the respective index wheels, parallel to the axis of drive shaft 22. Therafter, as index wheels 29 and 31 diverge from inner index wheels 28 and 30, tape 12 is gradually pushed off and stripped from leads 13. Ultimately, wheels 29 and 31 slide outwardly to the point where the ends of leads 13 are flush with the outside surfaces of the pitch gears, entirely removing tape strips 12 from the leads. Tape strips 12, after removal from leads 13, are suitably routed to a disposal mechanism, such as a reel or enclosure (neither shown).

Referring again to FIG. 1, after tape strips 12 are removed from leads 13, the components continues to be indexed through the cycle of wheels 28 and 30 and are ultimately deposited, in sequence, in a suitable receiving mechanism, such as a chute 110 for transport to the next stage of processing or a storage bin. Provision of the detaped components in the same sequence as on the tape is particularly advantageous in many circumstances.

It should be appreciated that the foregoing description is of a preferred exemplary embodiment of the present invention, and that the invention is not limited to the specific forms shown. For example, while the preferred exemplary embodiment operates upon axial leaded components, the apparatus can readily be adapted to operate upon radial leaded components. Also, to facilitate operation upon components having particularly long leads, such as class III components, index wheel helpers, essentially identcal to index wheels 28 and 30, can be interposed between index wheels 28 and 30 and detaping index wheels 29 and 31. Shafts 90 would extend through bores in the intermediate wheels, and suitably would be fixed therein. The intermediate wheels would rotate on drive shaft 22 in synchronism and registry with index wheels 28 and 30. These and other modifications can be made in the design and arrangement of the elements within the scope of the invention as expressed in the appended claims.

We claim:

1. Detaping apparatus, including means for operating upon tape components, said components having a body and at least one lead, the leads of the respective components being adhered, at substantially regular intervals, to at least one strip of tape, said apparatus comprising:

first and second rotatable index wheels;

means for disposing said first index wheel for rotation about a first axis of rotation;

means for disposing said second index wheel for rotation about a second axis of rotation, said second axis of rotation being at a predetermined angle with respect to said first axis;

means for rotating said first and second index wheels in synchronism, such that, as said index wheels rotate through a cycle about their respective axes, the distance between corresponding points along the perimeter of each of said index wheels varies; and means for disposing said first and second rotatable index wheels to engage each said lead in sequence at a predetermined position in their cycle, engaging said lead between said tape and said component body, the distance between the points at which said first and second index wheels engage said lead thereafter increasing to strip said tape from said lead.

2. The apparatus of claim 1, wherein said predetermined angle is in the range of approximately 8 to approximately 8.5 degrees.

3. The apparatus of claim 1, including means for operating upon taped components having at least first and second axial leads, the first and second leads of the respective components being adhered, at substantially regular intervals, to at least first and second strips of tape, respectively, said apparatus further including:

third and fourth index wheels;

means for disposing said third index wheel for rotation about a third axis of rotation substantially parallel to said first axis of rotation;

means for disposing said fourth index wheel for rotation about a fourth axis of rotation, said fourth axis being at a predetermined angle with respect to said third axis;

means for rotating said third and fourth index wheels in synchronism with said first and second index wheels, such that, as said index wheels rotate through a cycle about their respective axes, the distance between corresponding points along the perimeter of said third and fourth index wheels varies; and means for disposing said first and second index wheels to engage each of said first axial leads, in sequence at a predetermined position in their cycle, engaging said first axial lead between said body and said first strip of tape;

means for disposing said third and fourth index wheels to engage said second axial leads at a predetermined position in their cycle, engaging said second lead between said body and said second strip of tape.

4. The apparatus of claim 3, wherein said third axis of rotation is substantially coincident with said first axis of rotation.

5. The apparatus of claim 3, further including:

means for directing said component bodies between said first and third index wheels.

6. The apparatus of claim 3, wherein said predetermined angle between said third and fourth axes is in the range of approximately 8 to approximately 8.5 degrees.

7. The apparatus of claim 1, wherein at least one of said index wheels comprises a wheel hub, and a peripherally toothed ring fixed to said hub.

8. The apparatus of claim 1, wherein:

said second index wheel includes a central bore and an offset bore;

said means for disposing said second index wheel for rotating about said second axis comprises:

a cam having a central axis and a bore extending therethrough at said predetermined angle relative to the central axis of said cam, said cam being received in said second index wheel central bore to rotatably mount said second index wheel on said cam; and said means for rotating comprises: a drive shaft disposed along said first axis; and at least one rod, secured to said first index wheel, and slidably received in said second index wheel offset bore; and said means for disposing said first index wheel comprises means for securing said first index wheel to said drive shaft.

9. The apparatus of claim 8, wherein said means for disposing said second index wheel further comprises means for disposing said cam at a predetermined radial position with respect to said drive shaft.

* * * * *